(12) United States Patent
Kato

(10) Patent No.: US 10,420,229 B2
(45) Date of Patent: Sep. 17, 2019

(54) ELECTRONIC DEVICE

(71) Applicant: DENSO CORPORATION, Kariya, Aichi-pref. (JP)

(72) Inventor: Yoshiki Kato, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/168,274

(22) Filed: Oct. 23, 2018

(65) Prior Publication Data

US 2019/0166705 A1     May 30, 2019

(30) Foreign Application Priority Data

Nov. 29, 2017   (JP) ................................. 2017-229423

(51) Int. Cl.
*H05K 5/00*     (2006.01)
*H05K 5/04*     (2006.01)
*H05K 5/02*     (2006.01)
*H05K 1/18*     (2006.01)

(52) U.S. Cl.
CPC ............ *H05K 5/0034* (2013.01); *H05K 1/18* (2013.01); *H05K 5/0073* (2013.01); *H05K 5/0217* (2013.01); *H05K 5/0247* (2013.01); *H05K 5/04* (2013.01)

(58) Field of Classification Search
CPC combination set(s) only.
See application file for complete search history.

(56) References Cited

U.S. PATENT DOCUMENTS

| | | | |
|---|---|---|---|
| 10,206,295 B2* | 2/2019 | Van Roon | H05K 5/003 |
| 2018/0035555 A1* | 2/2018 | Kaneko | B60R 16/0231 |
| 2018/0228035 A1* | 8/2018 | Inoue | G06F 1/20 |
| 2019/0104631 A1* | 4/2019 | Nekagawa | G11B 33/12 |
| 2019/0166702 A1* | 5/2019 | Van Roon | H05K 5/006 |

FOREIGN PATENT DOCUMENTS

| | | |
|---|---|---|
| JP | 2007-005729 A | 1/2007 |
| JP | 2007-261424 A | 10/2007 |
| JP | 2012-155986 A | 8/2012 |

* cited by examiner

*Primary Examiner* — Lisa Lea-Edmonds
(74) *Attorney, Agent, or Firm* — Posz Law Group, PLC

(57) ABSTRACT

This electronic device includes a metallic casing that accommodates a component and a circuit board in respective spaces separated by a partition wall, and a metallic cover for protecting the circuit board by covering the casing. The cover has a protruding portion protruding toward the accommodating space for accommodating the circuit board, and the casing has a receiving portion to which the protruding portion is fitted at a position corresponding to the protruding portion. The cover has a deformation suppressing portion formed so that a bending rigidity with respect to a bending which is bent with a forming position of the protruding portion as a fulcrum and is directed to a protruding direction of the protruding portion as a fulcrum is greater than a bending rigidity in planar structure in a facing surface opposed to the circuit board.

11 Claims, 8 Drawing Sheets

ELECTRONIC DEVICE

CROSS REFERENCE TO RELATED APPLICATION

The present application is based on Japanese Patent Application No. 2017-229423 filed on Nov. 29, 2017, disclosure of which are incorporated herein by reference.

FIELD

The disclosure of this specification relates to a mechanically and electrically integrated electronic device.

BACKGROUND ART

There is a mechanically and electrically integrated electronic device in which a component and a circuit board for controlling the component are integrally assembled. An integral module as a whole is formed in such a manner that the component and circuit board are assembled in a common casing.

SUMMARY

The present disclosure provides an electronic device including a metallic casing that accommodates a component and a circuit board in respective spaces separated by a partition wall, and a metallic cover for protecting the circuit board by covering the casing. The cover has a protruding portion protruding toward the accommodating space for accommodating the circuit board, and the casing has a receiving portion to which the protruding portion is fitted at a position corresponding to the protruding portion. The cover has a deformation suppressing portion formed so that a bending rigidity with respect to a bending which is bent with a forming position of the protruding portion as a fulcrum and is directed to a protruding direction of the protruding portion as a fulcrum is greater than a bending rigidity in planar structure in a facing surface opposed to the circuit board.

DETAILED DESCRIPTION

Hereinafter, embodiments for implementing the present disclosure will be described referring to drawings. In each embodiment, a constituent element corresponding to a constituent element in a preceding embodiment with a reference sign or numeral may be denoted by the same reference sign or numeral, to omit redundant explanation. When only a part of a configuration is described in an embodiment, another preceding embodiment may be applied to the other parts of the configuration. It may be possible not only to combine parts the combination of which is explicitly described in an embodiment, but also to combine parts of respective embodiments the combination of which is not explicitly described if any obstacle does not especially occur in combining the parts of the respective embodiments.

First Embodiment

First, with reference to FIG. 1 and FIG. 2, a schematic configuration of an electronic device according to the present embodiment will be described.

Figure 1:
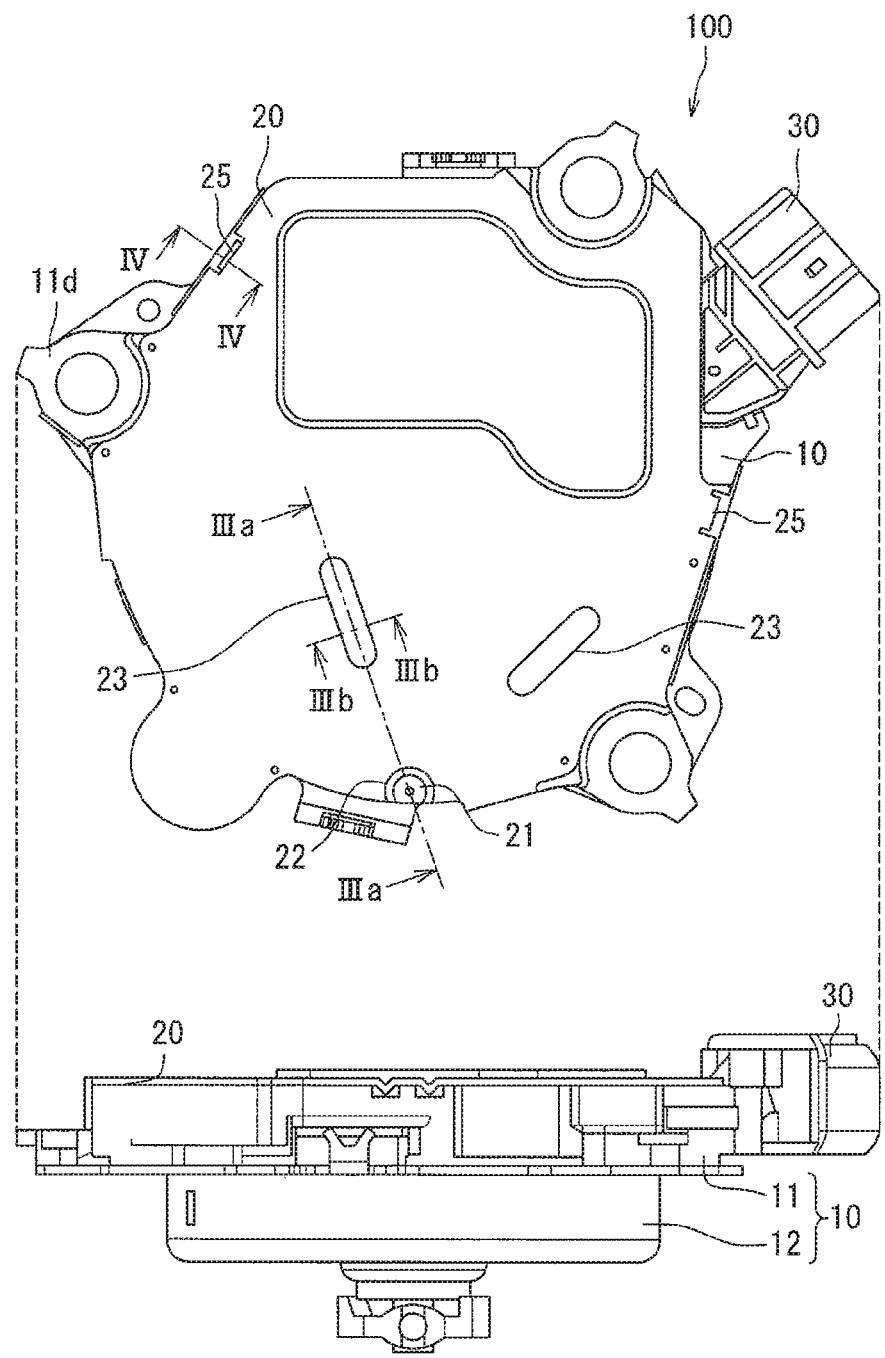
FIG. 1 is a diagram showing a schematic configuration of an electronic device according to a first embodiment.
Figure 2:
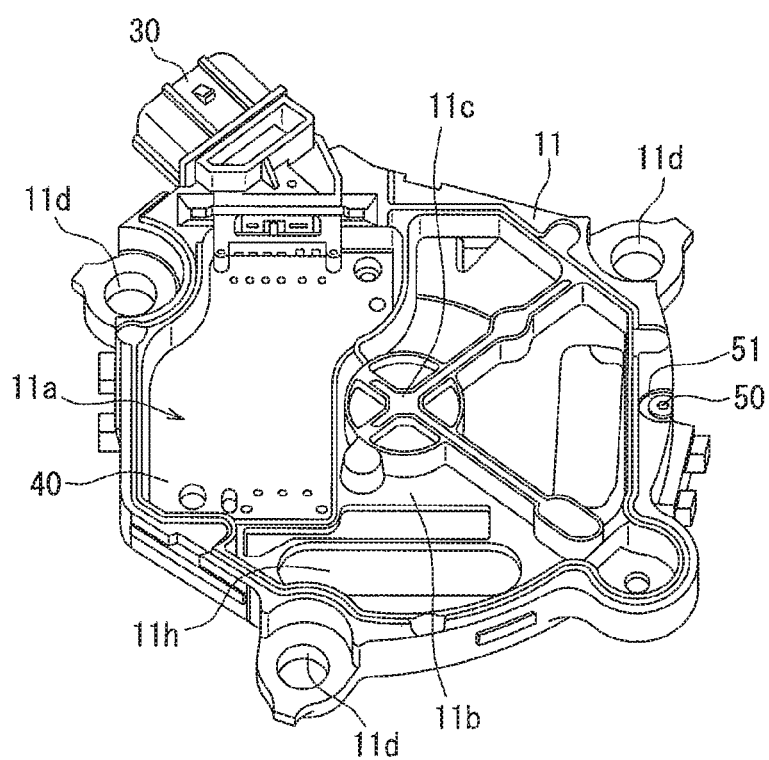
FIG. 2 is a diagram showing a schematic configuration of a first casing of the electronic device.

As shown in FIG. 1, the electronic device 100 includes a casing 10, a cover 20, and a connector 30, and further includes a circuit board 40 (invisible in FIG. 1) and a motor (not shown) which is a part of the components. Both the casing 10 and the cover 20 are made of metal. The material is aluminum, for example, and is formed into a predetermined shape by die casting. The connector 30 is made of resin and is fitted in the casing 10 to form an integrated module. The concept of components includes the above-mentioned motors, and further includes movable elements such as motors, as well as electrical elements such as connectors, bus bars and power modules.

The casing 10 has a first casing 11 for accommodating the circuit board 40 and a second casing 12 for accommodating the motor. As shown in FIG. 2, the first casing 11 has a substantially cylindrical shape with a bottom, and has an accommodating space 11a for accommodating the circuit board 40 in a cylinder. Electronic components such as microcomputer and discrete components are mounted on the front and back surfaces of the circuit board 40, and the circuit board 40 is screwed to a bottom surface 11b of the first casing 11 and housed in the accommodating space 11a. A lead wire (not shown) extending from the connector 30 is connected to the circuit board 40 so as to enable electrical communication with external equipment. In addition, a through hole 11h is provided in a part of a surface that constitutes the accommodating space 11a in the bottom surface 11b. A control terminal extending from the motor provided on the outside of the first casing 11 is inserted through the through hole 11h toward the accommodating space 11a and connected to the circuit board 40 via the connector (not shown).

The first casing 11 has a bearing accommodating portion 11c for accommodating the bearing in a vicinity of the center and a fixing hole 11d for screwing the first casing 11 to another member.

Furthermore, the first casing 11 in the present embodiment has a receiving portion 50 to which a protruding portion 21 provided in the cover 20 described later is fitted, and a recessed portion 51 for accommodating an elastic portion 22 described later. Detailed structures of the protruding portion 21, the elastic portion 22, the receiving portion 50, the recessed portion 51 and the vicinity thereof will be described later.

The motor is mounted on an outer surface of the bottom surface 11b of the first casing 11, and a shaft (not shown) is disposed so as to be accommodated in the bearing accommodating portions 11c together with the bearings. The control terminal extending from the motor passes through the through hole 11h formed in the bottom surface 11b and reaches the circuit board 40. The second casing 12 is fixed to the first casing 11 so as to cover the outer side of the motor, and forms a body of the integral casing as a whole. That is, the circuit board 40 and the motor which is a part of the components, are accommodated in two accommodating spaces divided by using the bottom surface 11b of the first casing 11 as a partition wall.

As shown in FIG. 1, the cover 20 is fixed so as to cover an opening of the first casing 11 and isolates the accommodating space of the circuit board 40 from the external space. By covering the accommodating space with the cover 20, dustproof for the circuit board 40 is realized.

Figure 3:
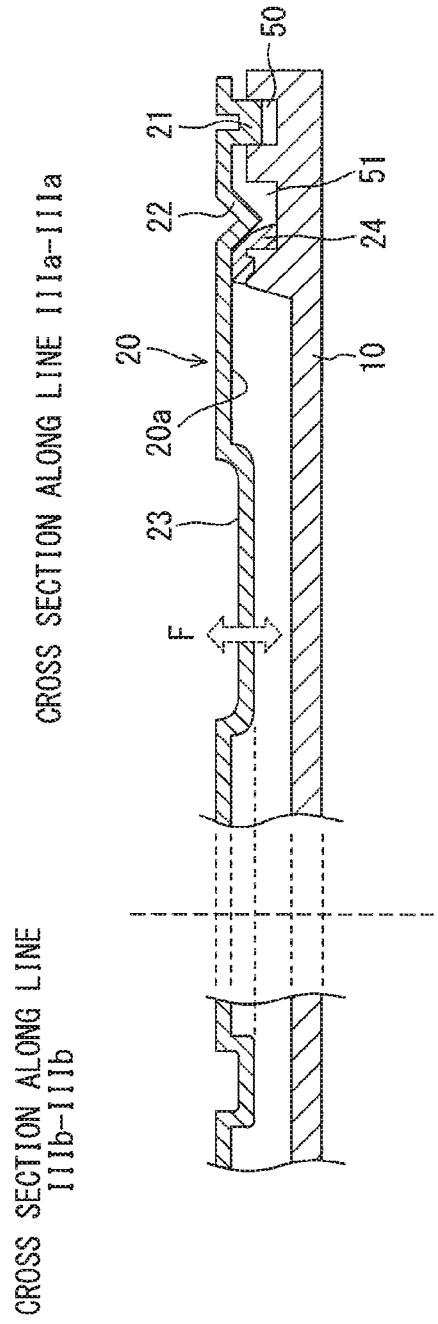
FIG. 3 is a cross-sectional view of the first casing and a cover.

As shown in FIG. 1 and FIG. 3, the cover 20 has the protruding portion 21, the elastic portion 22, and a deformation suppressing portion 23. The first casing 11 has the receiving portion 50 corresponding to the protruding portion 21 and the recessed portion 51 corresponding to the elastic portion 22. The protruding portion 21 is fitted into the receiving portion 50 by being pushed into the receiving portion 50, and the cover 20 is fixed to the first casing 11. FIG. 3 shows the cross section along line IIIa-IIIa and the cross section along line IIIb-IIIb in FIG. 1.

The protruding portion 21 of the present embodiment is provided in a vicinity of an outer edge of the cover 20 and protrudes in a cylindrical shape. The protruding portion 21 is formed so as to protrude toward the accommodating space of the casing 10 by a method such as press working.

The elastic portion 22 mitigates the deformation of the cover 20 due to the force applied to the protruding portion 21 when pushing the protruding portion 21 into the receiving portion 50. Specifically, the elastic portion 22 extends in a direction orthogonal to a radiation direction around the forming position of the protruding portion 21 as a center. As shown in FIG. 3, the elastic portion 22 is formed so as to be elastically deformable with respect to the bending force F along the protruding direction of the protruding portion 21 with the forming position of the protruding portion 21 as a fulcrum. The elastic portion 22 of the present embodiment is formed around the portion where the protruding portion 21 is formed, and more specifically, it is formed in an annular shape so as to surround the protruding portion 21. Since the protruding portion 21 is provided on the outer edge of the cover 20, the elastic portion 22 is naturally not formed in a portion where the cover 20 does not exist, and as shown in FIG. 1, is formed in a C shape in the portion where the cover 20.

The elastic portion 22 may have any shape as long as it can absorb energy as elastic energy so that the energy for pushing the protruding portion 21 toward the casing 10 side is less likely to propagate to a portion outside the elastic portion 22 of the cover 20. As shown in FIG. 3, it is possible to adopt a shape bent into a V shape as a cross section. In the elastic portion 22 in the present embodiment, when viewing a facing surface 20a facing the circuit board 40 in the front view, the surface constituting the cover 20 with respect to the facing surface 20a is crest-folded so as to have elasticity. That is, in the cover 20, the elastic portion 22 is formed by forming a V-shaped bent portion around the protruding portion 21 over the entire circumference.

The receiving portion 50 and the recessed portion 51 are formed in the first casing 11 so as to correspond to the shapes of the protruding portion 21 and the elastic portion 22. The receiving portion 50 has a cylindrical shape, and the columnar protruding portion 21 is pushed into the receiving portion 50, thereby eliminating the clearance therebetween and joining them. The recessed portion 51 is formed in an annular shape around the receiving portion 50 corresponding to the elastic portion 22 formed around the protruding portion 21. In this embodiment, since the elastic portion 22 is formed in a C shape, as shown in FIG. 2, the recessed portion 51 also has a C-shaped structure correspondingly. The recessed portion 51 is provided so that the tip on the accommodating side of the elastic portion 22 bent in a mountain fold side does not come into contact with the first casing 11, and the elastic portion 22 can efficiently accumulate elastic energy.

In the cover 20, the protruding portion 21 is pushed into the receiving portion 50, and the waterproof adhesive 24 seals between the cover 20 and the first casing 11. Therefore, waterproofing and dustproofing effect are exerted.

The cover 20 further has the deformation suppressing portion 23. The deformation suppressing portion 23 is a rib formed by deforming a part of a flat surface of the cover 20 so as to be convex toward the accommodating space for accommodating the circuit board 40. As shown in FIG. 1, in the present embodiment, the deformation suppressing portions 23 are formed in two places. The deformation suppressing portions 23 are formed so as to extend in the radial direction around the position where the protruding portion 21 is formed, and are formed so as to be hollowed into a capsule shape when viewing the cover 20 from the external space in the front view. As shown in FIG. 3, the deformation suppressing portion 23 is recessed so as to protrude toward the facing surface 20a side.

The deformation suppressing portion 23 is formed so as to extend in the radial direction around the shape position of the protruding portion 21 and has an elongated shape. Therefore, as shown in FIG. 3, the bending rigidity with respect to the bending force F directed toward the protruding direction of the protruding portion 21 with the forming position of the protruding portion 21 as a fulcrum is larger than the bending rigidity in a simple plane on which the deformation suppressing portion 23 is not formed.

The number of deformation suppression portions 23 is not limited to two, and may be one or three or more. It is more preferable that the deformation suppressing portion 23 is formed to extend in a straight line connecting the forming position of the protruding portion 21 and a forming position of a plate piece portion 25.

Figure 4:
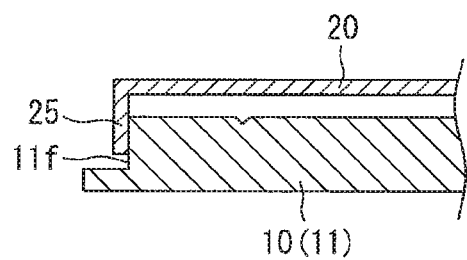
FIG. 4 is a cross-sectional view showing a structure of a plate piece portion.

As shown in FIGS. 1 and 4, the cover 20 has two plate piece portions 25. The two plate piece portions 25 are formed at positions where the cover 20 can be fixed at three points, including the forming position of the protruding portion 21 as one point. The plate piece portions 25 are formed so as to protrude from the outer edge of a portion covering the accommodating space 11a in the cover 20 at a substantially right angle to the surface covering the accommodating space 11a. The plate piece portions 25 are formed by forming a blade-shaped portion protruding from the outer edge of the cover 20 by, for example, press working and bending the blade shape portion toward the casing 10 side. The plate piece portions 25 are provided so as to rub against a side wall 11*f* of the first casing 11 when the cover 20 is fixed to the first casing 11. That is, the plate piece portions 25 are fixed in a state in which the side wall 11*f* is urged by elasticity due to bending, and when the cover 20 is fixed, the plate piece portions are friction-fixed to the side wall 11*f*.

The connector 30 has lead wires and the like (not shown) which are stored in a resin case. The case of the connector 30 is formed so as to be fitted to the first casing 11 of the casing 10, and is fixed while being sandwiched between the first casing 11 and the cover 20 when the first casing 11 is covered. The leads of the connector 30 are connected to the circuit board 40 and connected to electronic components such as a microcomputer mounted on the circuit board 40. The circuit board 40 is mutually connected to a power supply or another electronic device provided externally via the connector 30.

Next, the function and effect obtained by adopting the electronic device 100 in the present embodiment will be described.

By fitting the protruding portion 21 to the receiving portion 50 provided in the casing 10, the cover 20 is fixed. The protruding portion 21 can be relatively easily formed by, for example, die casting or press working. Therefore, compared to the configuration in which the claw portion and its receiving portion are formed on either the cover or the casing, the portion related to the fixing of the cover 20 can be formed at low cost.

In fixing the cover 20 to the casing 10, the protruding portion 21 formed on the cover 20 is fitted and fixed to the receiving portion 50 formed inside the outer edge of the casing 10, so that a portion for fixing the cover 20 never projects outward from the outer edge of the casing 10. In other words, an extended portion for caulking and fixing the cover is not needed so as to protrude outward on the outer periphery of the casing. Therefore, it is possible to reduce the size of the casing 10, save the space for the installation place of the electronic device 100, and improve the degree of freedom of installation of the electronic device 100.

The cover 20 has the deformation suppressing portion 23. The deformation suppressing portion 23 is formed so as to extend in the radial direction around the shape position of the protruding portion 21 and has an elongated shape. Therefore, as shown in FIG. 3, the bending rigidity with respect to the bending force directed toward the protruding direction of the protruding portion 21 with the forming position of the protruding portion 21 as a fulcrum is larger than the bending rigidity in a simple plane on which the deformation suppressing portion 23 is not formed. Therefore, the amount of deformation of the flat surface of the cover 20 when the protruding portion 21 is pushed into the receiving portion 50 can be suppressed compared with a configuration in which the deformation suppressing portion 23 is not formed. Since the amount of deformation of the cover 20 can be suppressed, it is possible to suppress interference with other components and members disposed in the vicinity of the electronic device 100. It is preferable that the deformation suppressing portion 23 be formed to extend in the radial direction around the shape position of the protruding portion 21. More preferably, the deformation suppressing portion 23 is preferably formed to extend in a straight line connecting the forming position of the protruding portion 21 and the forming position of the plate piece portion 25. It is assumed that the stress of bending the cover 20 acts on the protruding portion 21 to which direct force is applied at the time of pushing the cover 20 and on the plate piece portion 25 to which force is applied by friction. On the other hand, by forming the deformation suppressing portion 23 in a straight line connecting the forming position of the protruding portion 21 and the forming position of the plate piece portion 25, the bending rigidity against the force applied to the cover 20 can be enhanced.

The cover 20 has the elastic portion 22. The elastic portion 22 absorbs the energy pushing the protruding portion 21 toward the casing 10 so that it does not easily propagate to a portion outside the elastic portion 22 of the cover 20. Therefore, the amount of deformation of the flat surface of the cover 20 when the protruding portion 21 is pushed into the receiving portion 50 can be suppressed compared with a configuration in which the elastic portion 22 is not formed.

As long as at least a part of the elastic portion 22 is formed along the circumferential direction orthogonal to the radial direction around the forming position of the protruding portion 21, the above-described effect is exerted. More preferably, as in the case of the elastic portion 22 in the present embodiment, the elastic portion 22 is formed over the entire periphery of the protruding portion 21 so that it is possible to more effectively convert the energy pushing the cover 20 into elastic energy.

The casing 10 has the recessed portion 51 at a position corresponding to the elastic portion 22 in the first casing 11 with which the cover 20 is in contact. The distal end of the elastic portion 22 formed so as to protrude inward from the facing surface 20*a* of the cover 20 does not contact the first casing 11 by the recessed portion 51. As a result, the elastic portion 22 can be kept in a state of floating in the air with respect to the first casing 11, so that the elastic portion 22 can efficiently store the elastic energy.

As described above, it is preferable that the elastic portion 22 is completely floated from the first casing 11, but as shown in FIG. 3, the waterproof adhesive 24 may be in contact with a part of the elastic portion 22. Compared with a configuration in which the elastic portion 22 directly contacts the first casing 11, the present embodiment has an effect of absorbing elastic energy. This is because the waterproof adhesive 24 is hardened after a sufficient time has elapsed since the cover 20 was pushed into the casing 10 in the manufacturing process of the electronic device 100, so that the elastic portion 22 is fixed in a shape absorbing elastic energy. That is, the contact of the elastic portion 22 with the waterproof adhesive 24 does not affect the absorption of elastic energy.

As shown in FIG. 4, the casing 10 has the plate piece portion 25. The electronic device 100 according to the present embodiment is fitted and fixed by pushing one protruding portion 21 into the receiving portion 50. In addition, the cover 20 is fixed to the casing 10 at three points together with the two plate piece portions 25 and the protruding portion 21. Since the plate piece portion 25 is frictionally fixed in contact with the side wall 11*f* of the casing 10, the cover 20 can be capped without warping up even in a place far from the forming position of the protruding portion 21. That is, the deformation of the cover 20 can be further suppressed, by including the plate piece portion 25 in addition to the elastic portion 22 and the deformation suppressing portion 23.

Although the number of the protruding portions 21 is not limited, in the configuration in which only one protruding portion 21 is formed as in the present embodiment, there is a possibility that the cover 20 rotates with respect to the casing 10 around the forming position of the protruding portion 21 as the center. On the other hand, by fixing the cover 20 to the casing 10 by the two plate piece portions 25 at three points, it is possible to suppress the rotational motion of the cover 20. From the viewpoint of suppressing the rotational motion, the effect can be exerted if it is fixed at at least two points including the protruding portion 21. In addition to this configuration, by fixing the cover 20 to the casing 10 at three or more points including the protruding portion 21, it is possible to further suppress the floating due to the warp of the cover 20 caused by pressing the cover 20.

Second Embodiment

Figure 5:
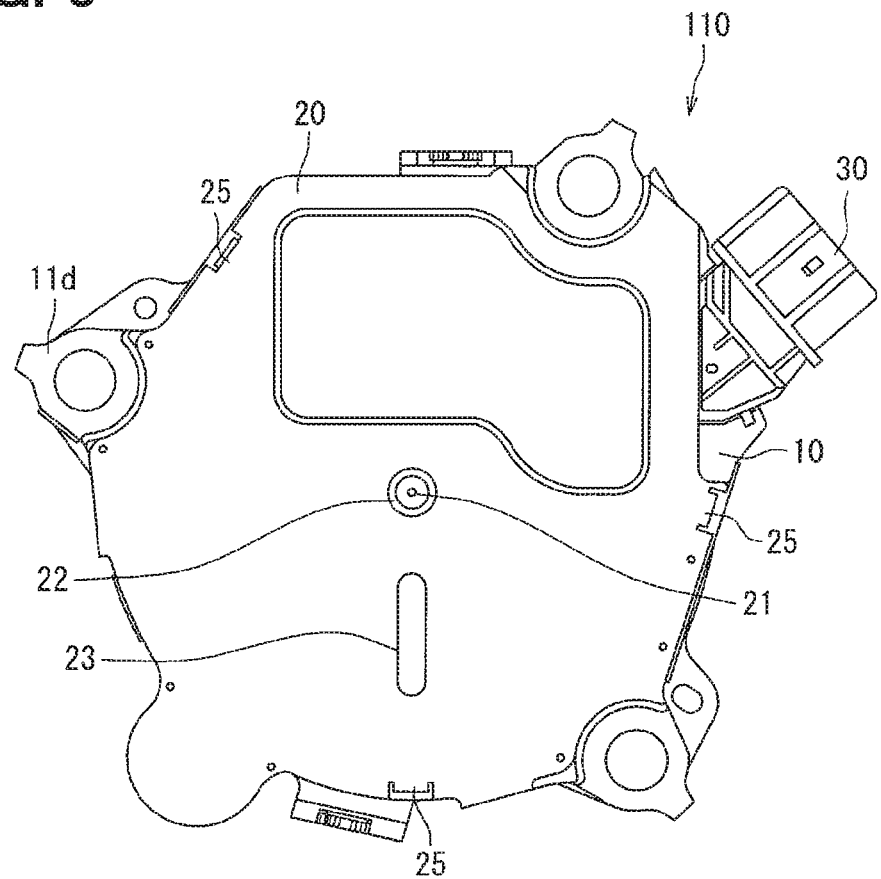
FIG. 5 is a diagram showing a schematic configuration of an electronic device according to a second embodiment.

In the first embodiment, the protruding portion 21 is formed in the vicinity of the outer edge of the cover 20, and is fixed to the casing 10 with the outer edge of the cover 20 together with the plate piece portion 25. On the other hand, as shown in FIG. 5, the electronic device 110 according to the present embodiment has one protruding portion 21 and one elastic portion 22 at substantially the center of the cover 20. Further, the electronic device 110 has three plate piece portions 25.

The elastic portion 22 is formed over the entire periphery of the protruding portion 21. In addition, the electronic device 110 has one deformation suppressing portion 23. The deformation suppressing portion 23 has the same shape as that of the first embodiment and is formed to extend in the radial direction from the forming position of the protruding portion 21. That is, the deformation suppressing portions 23 are formed so as to extend in the radial direction around the position where the protruding portion 21 is formed, and are formed so as to be hollowed into a capsule shape when viewing the cover 20 from the external space in the front view, and has a concave shape so as to protrude toward the facing surface 20a side. As in the first embodiment, a plurality of deformation suppressing portions 23 may be formed, but even if there is only one deformation suppression portion, it is possible to increase the bending rigidity and suppress the deformation amount of the cover 20 by pushing the protruding portion 21. In addition, when a plurality of deformation suppressing portions 23 are provided, the volume of the accommodating space 11a formed in the casing 10 is decreased. Therefore, it is possible to secure the accommodating space 11a having a smaller number of deformation suppressing portions 23 as much as possible.

The electronic device 110 in the present embodiment has three plate piece portions 25. As in the first embodiment, the plate piece portion 25 is provided on the outer edge of the cover 20 and is adapted to bias the side wall 11f of the first casing 11. The plate piece portion 25 contacts the side wall 11f so as to frictionally fix the cover 20 to the casing 10. That is, the cover 20 is fixed by fitting the protruding portion 21 to the receiving portion 50, and is friction-fixed by the three plate piece portions 25, and is fixed together at four points.

Figure 6:
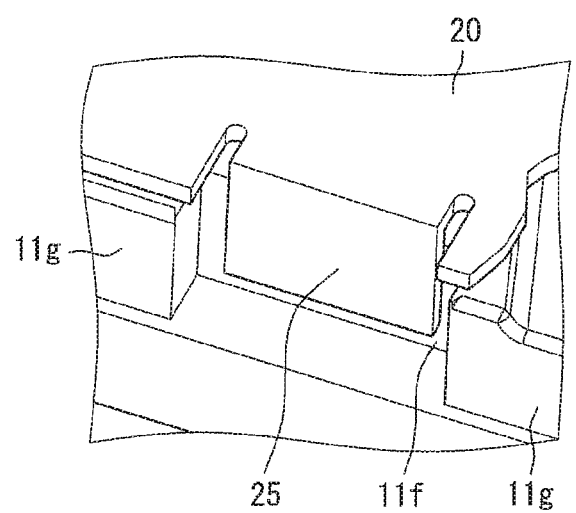
FIG. 6 is a view showing a configuration of a plate piece portion and a projection portion.

As shown in FIG. 6, the casing 10 according to the present embodiment has a projecting portion 11g projecting slightly outward from the side wall 11f in the vicinity of a portion of the side wall 11f in contact with the plate piece portion 25. When the cover 20 rotates around the forming position of the protruding portion 21 as the rotation center, the projecting portion 11g is disposed so as to hinder the movement of the plate piece portion 25. That is, the cover 20 does not rotate any more since the plate piece portion 25 contacts the projecting portion 11g.

According to this configuration, for example, after pushing the protruding portion 21 into the receiving portion 50 of the casing 10, the cover 20 is intentionally rotated around the forming position of the protruding portion 21 as the center, and the plate piece portion 25 hits the projecting portion 11g so as to stop the rotation of the cover 20 at that point, so that the position of the cover 20 can be uniquely determined.

It is particularly significant to have such a projecting portion 11g in a configuration in which the protruding portion 21 is positioned substantially at the center of the cover 20 as in the present embodiment. However, even in the configuration in which the protruding portion 21 is formed on the outer edge of the cover 20 as in the first embodiment, when the number of the protruding portions 21 is one, the cover 20 may rotate around the forming position of the protruding portion 21 as the center. Therefore, positional deviation due to the rotation of the cover 20 can be suppressed by providing the projecting portion 11g.

Third Embodiment

Figure 7:
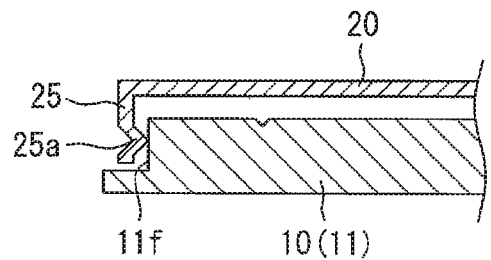
FIG. 7 is a cross-sectional view showing a configuration of a plate piece portion in the electronic device according to a third embodiment.

The first embodiment and the second embodiment explained that the surface of the plate piece portion 25 facing the side wall 11f of the casing 10 makes surface contact with the side wall 11f so as to contribute to friction fixing. On the other hand, as shown in FIG. 7, the plate piece portion 25 in the present embodiment is provided with a biasing portion 25a which protrudes from the plate piece portion 25 toward the side wall 11f and makes contact with the side wall 11f.

The biasing portion 25a of the present embodiment is formed by bending the vicinity of the distal end side of the plate piece portion 25 and a mountain folded portion of the biasing portion 25a makes line contact with the side wall 11f. As shown in FIG. 7, the plate piece portion 25 in the present embodiment has a structure like a cantilever by the biasing portion 25a, and the biasing portion 25a is urged toward the side wall 11f by the elasticity of the plate piece portion 25 by the cantilever structure, and the cover 20 is frictionally fixed to the casing 10.

According to this configuration, as compared with the configuration in which the plate piece portion 25 is in surface contact with the casing 10 as in the first embodiment and the second embodiment, when positioning the cover 20 on the casing 10, a clearance is generated. So, it is easy to dispose the cover 20 in the casing 10.

Fourth Embodiment

Figure 8:
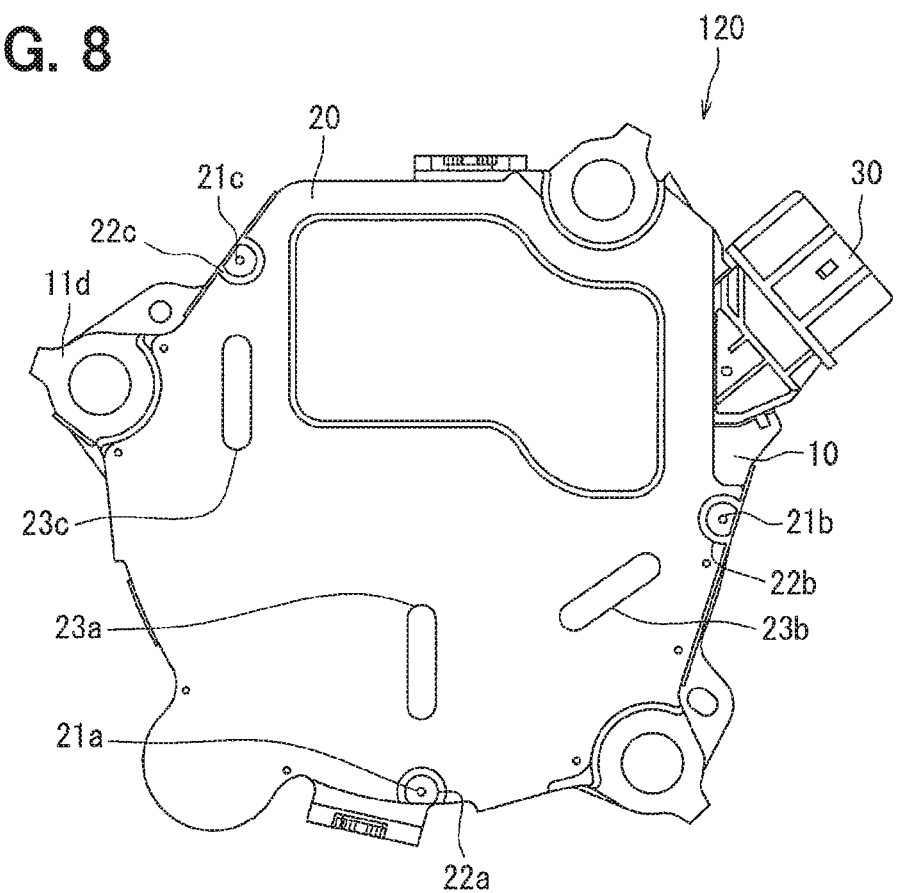
FIG. 8 is a diagram showing a schematic configuration of an electronic device according to a fourth embodiment.
Figure 9:
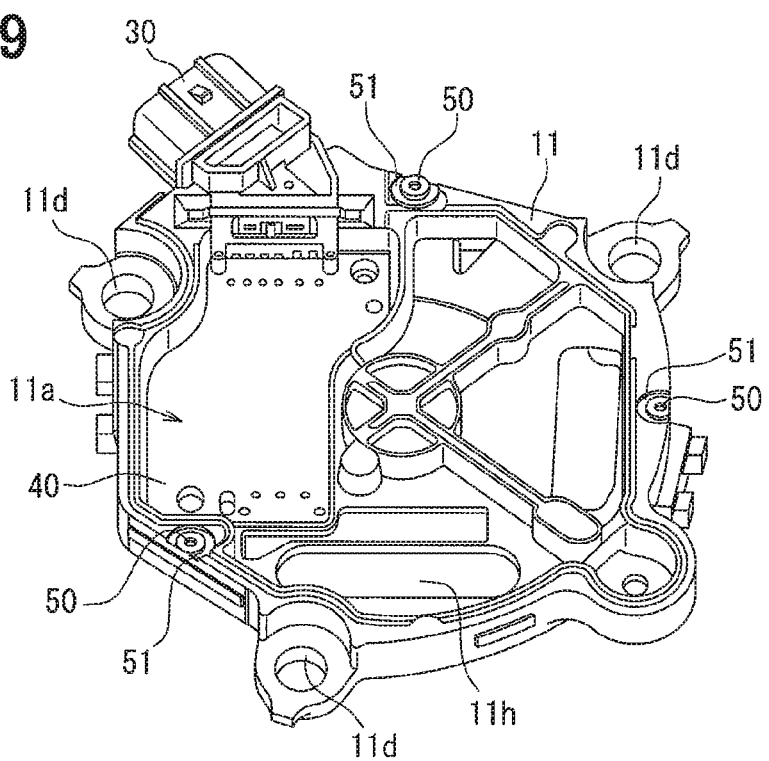
FIG. 9 is a diagram showing a schematic configuration of a first casing of the electronic device.

The cover 20 may have a plurality of protruding portions 21. As shown in FIGS. 8 and 9, the electronic device 120 in the present embodiment has three protruding portions 21 and three receiving portions 50 corresponding to the protruding portions 21. In FIG. 8, reference numerals 21a, 21b, and 21c are added to each of the three protruding portions 21.

Since the cover 20 has three protruding portions 21 at positions separated from each other at its outer edge portion of the cover 20, the cover 20 is fixed to the casing 10 at three points. Thereby, the cover 20 and the casing 10 can be more firmly fixed as compared with the configuration in which there is one protruding portion 21. Further, since the cover 20 is fixed at three points, it is also possible to prevent the cover 20 from being displaced in the rotational direction.

In the cover 20, an elastic portion 22 is formed around the forming position of each protruding portion 21. Specifically, the elastic portion 22a is formed around the protruding portion 21a, the elastic portion 22b is formed around the protruding portion 21b, and the elastic portion 22c is formed around the protruding portion 21c. Thereby, the energy given to the cover 20 when pushing the protruding portion 21 into the casing 10 can be absorbed by the elastic portion 22 as elastic energy, and deformation of the cover 20 can be suppressed. Since the elastic portion 22 in the present embodiment is formed on the outer edge of the cover 20, it is not formed over the entire periphery of the forming position of the protruding portion 21 but is formed in a C-shape in which a part is missing.

As shown in FIG. 9, the casing 10 has three receiving portions 50 corresponding to the protruding portions 21 formed on the cover 20, and furthermore, the recessed portion 51 corresponding to the elastic portions 22 is provided around each of the receiving portions 50. Each recessed portion 51 is formed on the outer edge of the first casing 11 according to the forming position of the elastic portion 22, so it is formed in a C shape like the elastic portion 22.

Further, the cover 20 in the present embodiment has three deformation suppressing portions 23. Specifically, three deformation suppressing portions 23 includes the deformation suppressing portion 23a formed so as to extend long and thin on the radiation at the forming position where the protruding portion 21a is formed, the deformation suppressing portion 23b formed so as to extend long and thin on the radiation at the position where the protruding portion 21b is formed, and a deformation suppressing portion 23c formed so as to extend long and thin on the radiation at the position where the protruding portion 21c is formed. As in the above-described embodiments, since the cover 20 has the deformation suppressing portion 23, the cover 20 can have a greater bending rigidity compared to the configuration in which the cover 20 has merely a flat surface. The amount of deformation of the cover 20 can be suppressed with respect to the force applied when the protruding portion 21 is pushed into the receiving portion 50.

In the embodiment having the plurality of protruding portions 21, it is not always necessary to form one or more deformation suppressing portions 23 corresponding to one protruding portion 21. That is, for example, in the electronic device 120 of the present embodiment, the cover 20 has only the deformation suppressing portions 23a and 23b, and the deformation suppressing portion 23c may be omitted.

Since the cover 20 of the electronic device 120 can be fixed to the casing 10 at three points by the three protruding portions 21, the cover 20 does not have the plate piece portion 25 for assisting fixation, but one or a plurality of plate piece portion 25 may be formed on the outer edge of the cover 20.

Other Embodiments

The disclosure in this specification and drawings etc. is not limited to the exemplified embodiment. The disclosure encompasses the illustrated embodiments and modifications by those skilled in the art based thereon. For example, the disclosure is not limited to the parts and/or combinations of elements shown in the embodiments. Disclosure can be implemented in various combinations. The disclosure may have additional parts that may be added to the embodiment. The disclosure encompasses omissions of parts and/or elements of the embodiments. The disclosure encompasses replacement or combination of parts and/or elements between one embodiment and another. The disclosed technical scope is not limited to the description of the embodiment. Several technical scopes disclosed are indicated by descriptions in the claims and should be understood to include all modifications within the meaning and scope equivalent to the descriptions in the claims.

Figure 10:
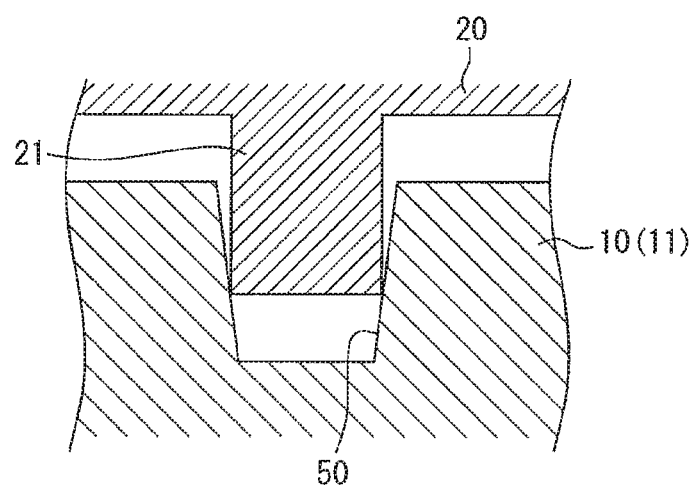
FIG. 10 is a cross-sectional view showing a configuration of a protruding portion and a receiving portion in another embodiment.

In each of the embodiments described above, the receiving portion 50 is exemplified as a hollow cylindrical structure, but as shown in FIG. 10, the inner wall of the receiving portion 50 may be formed with a taper. The diameter of the opening of the receiving portion 50 is made larger than the diameter of the protruding portion 21, and the receiving portion 50 is narrowed downward as it goes downward and is set to be substantially equal to or slightly smaller than the diameter of the protruding portion 21. As a result, the protruding portion 21 is pressed by the receiving portion 50 in the process of being fitted, and is fitted with the receiving portion 50 while being deformed.

Figure 11:
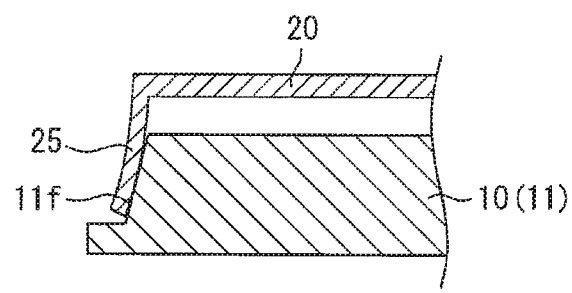
FIG. 11 is a cross-sectional view showing a configuration of a plate piece portion and a side wall in another embodiment.

In each of the above-described embodiments, the side wall 11f of the first casing 11 is exemplified as a structure that stands at right angles to the plane of the cover 20 at the portion where the plate piece portion 25 is in contact with. However, as shown in FIG. 11, it may be a tapered shape with a high gradient. When the cover 20 is fitted into the casing 10, the plate piece portion 25 is elastically deformed while being in surface contact with the side wall 11f so as to interpose the casing 10 between the side surfaces. As a result, as compared with the configuration in which the side wall 11f rises vertically, the vertical resistance received by the plate piece portion 25 from the side wall 11f can be increased and the frictional force can be increased. Therefore, the fixing strength of the cover 20 to the casing 10 can be increased.

Figure 12:
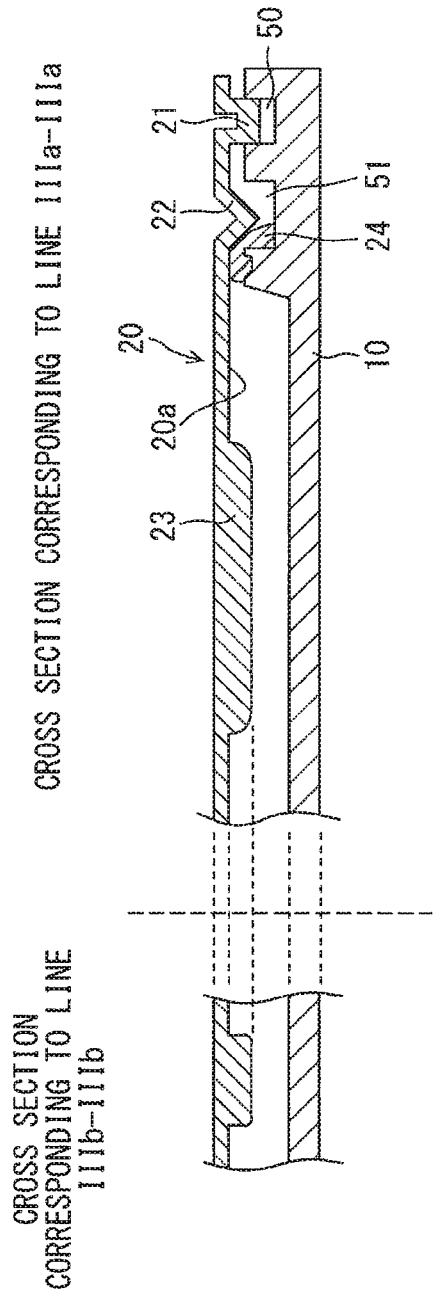
FIG. 12 is a cross-sectional view showing a configuration of a deformation suppressing portion in another embodiment.

In each of the embodiments described above, the example in which the ribs which are the deformation suppressing portions 23 and the protruding portion 21 are formed by press deformation of a part of the plane constituting the cover 20 has been described, but the present disclosure is not limited to this example. For example, as shown in FIG. 12, the deformation suppressing portion 23 may be formed by thickening a part of the plane of the cover 20. FIG. 12 shows the cross section corresponding to line IIIa-IIIa and the cross section corresponding to line IIIb-IIIb in FIG. 1. In this configuration, the deformation suppressing portion 23 has a shape in which a thickened part of the flat surface of the cover 20 extends radially from the forming position of the protruding portion 21. This makes it possible to increase the flexural rigidity as compared with a structure in a simple planar shape. Besides this, any structure can be adopted as long as the bending rigidity is larger than that in a mere planar shape. However, if the deformation suppressing portion 23 can be formed by pressing the cover 20, there is an advantage such that the process can be shared with another press working process. In each of the embodiments, the ribs as the deformation suppressing portion 23 are formed so as to protrude toward the accommodating space 11a in which the circuit board 40 is accommodated. However, it is also possible to provide a structure in which the spatial margin is provided on the accommodating space 11a side In the absence, ribs may be formed so as to protrude toward the outside of the accommodating space 11a, that is, toward the outside.

In each of the above-described embodiments, the elastic portion 22 is formed around the forming position of the protruding portion 21. The elastic portion exhibiting the same effect is also formed around the plate piece portion 25, so that the effect is more enhanced. When the cover 20 is pushed into the casing 10, a stress that can deform the cover 20 also occurs in the plate piece portion 25 frictionally fixed to the casing 10. Therefore, it is preferable that the elastic portion is provided not only around the protruding portion 21 but also around the plate piece portion 25. For the same reason, it is more preferable that the deformation suppressing portion 23 extending in the radial direction around the forming position of the plate piece portion 25 is formed. More preferably, the deformation suppressing portion 23 is preferably formed to extend in a straight line connecting the forming position of the protruding portion 21 and the forming position of the plate piece portion 25.

Further, in each embodiment, since the cover and the casing are fixed by fitting the protruding portion and the receiving portion, mutual fixation can be realized without providing the claw portion. In addition, since it is not necessary to form an expanded portion for caulking fixation in the casing, it is possible to suppress an increase in the size of the entire electronic device.

Further, the deformation suppressing portion is formed so that the flexural rigidity becomes larger as compared with the case where the cover is a simple flat plate (planar structure). The cover and the casing are fixed by fitting the protruding portion formed on the cover and the receiving portion formed on the casing. At that time, a bending stress is generated in the cover with the forming position of the protruding portion as a fulcrum. Since the deformation suppressing portion is formed so that the bending rigidity with the forming position of the protruding portion as a fulcrum is larger than that of a simple flat plate, deformation of the cover when fitting the protruding portion to the receiving portion can be suppressed.

What is claimed is:

1. An electronic control unit comprising:
    a metallic casing that accommodates a component and a circuit board in respective spaces separated by a partition wall; and
    a metallic cover that covers the casing so as to protect the circuit board, wherein
    the cover has a protruding portion protruding toward the accommodating space for accommodating the circuit board, the casing has a receiving portion to which the protruding portion is fitted at a position corresponding to the protruding portion, and
    the cover has a deformation suppressing portion formed so that a bending rigidity with respect to a bending which is bent with a forming position of the protruding portion as a fulcrum and is directed to a protruding direction of the protruding portion as a fulcrum is greater than a bending rigidity in planar structure in a facing surface opposed to the circuit board.

2. The electronic control unit according to claim 1, wherein
    the deformation suppressing portion is a rib formed so as to extend in a radial direction from a forming position of the protruding portion.

3. The electronic control unit according to claim 2, wherein:
    the rib is formed by deforming a part of a plane constituting the cover.

4. The electronic control unit according to claim 2, wherein:
    the rib is formed on the facing surface of the cover at the accommodating space side.

5. The electronic control unit according to claim 1, wherein
    the cover has a plate piece portion formed along at least a part of an outer edge along a side wall of the casing, and
    the plate piece portion is frictionally fixed by contacting at least a part with the side wall of the casing.

6. The electronic control unit according to claim 5, wherein:
    the plate piece portion is provided with an biasing portion protruding from the plate piece portion to the side wall side and making contact with the side wall of the casing, and the biasing portion is in line contact with the side wall of the casing, and is frictionally fixed.

7. The electronic control unit according to claim 5, wherein:
    in a case where the cover has only one protruding portion, the side wall of the casing has a protruding portion which is in a vicinity of a portion where the plate piece portion contacts, and which is formed on a track of the plate piece portion accompanying the rotation of the cover with a forming position of the protruding portion as a rotation center.

8. The electronic device according to claim 1, wherein
    the cover has an elastic portion that is elastically deformable in a direction orthogonal to a radial direction around the protruding portion around the forming position of the protruding portion.

9. The electronic control unit according to claim 8, wherein
    the elastic portion is formed so as to surround the forming position of the protruding portion.

10. The electronic device according to claim 8, wherein
    the casing has a recessed portion formed so that the elastic portion does not directly contact the casing at a position corresponding to the elastic portion.

11. The electronic device according to claim 5, wherein
    the deformation suppressing portion is formed to extend in a straight line connecting the forming position of the protruding portion and the forming position of the plate piece portion.

* * * * *